US009245792B2

(12) United States Patent
Chen et al.

(10) Patent No.: US 9,245,792 B2
(45) Date of Patent: Jan. 26, 2016

(54) METHOD FOR FORMING INTERCONNECT STRUCTURES

(75) Inventors: Neng-Kuo Chen, Sinshih Township (TW); Kuo-Hwa Tzeng, Taipei (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 12/179,991

(22) Filed: Jul. 25, 2008

(65) Prior Publication Data

US 2010/0022084 A1    Jan. 28, 2010

(51) Int. Cl.
*H01L 21/4763*  (2006.01)
*H01L 21/768*  (2006.01)
*H01L 21/02*  (2006.01)
*H01L 21/316*  (2006.01)

(52) U.S. Cl.
CPC .......... *H01L 21/7681* (2013.01); *H01L 21/022* (2013.01); *H01L 21/02134* (2013.01); *H01L 21/02137* (2013.01); *H01L 21/02164* (2013.01); *H01L 21/02203* (2013.01); *H01L 21/02274* (2013.01); *H01L 21/31608* (2013.01); *H01L 21/76801* (2013.01)

(58) Field of Classification Search
CPC ................... H01L 21/76802; H01L 21/76843; H01L 21/76838; H01L 21/76807; H01L 21/7684; H01L 21/76877
USPC .......... 438/637, 618, 622, 626; 257/773, 774, 257/E21.577, E23.011, E23.145
See application file for complete search history.

(56) References Cited

U.S. PATENT DOCUMENTS

| 6,037,664 | A * | 3/2000 | Zhao et al. ..................... 257/758 |
| 6,215,189 | B1 * | 4/2001 | Toyoda et al. ................. 257/773 |
| 6,218,079 | B1 * | 4/2001 | Shin ..................... H01L 21/7681 257/E21.579 |
| 6,225,211 | B1 * | 5/2001 | Tsui .................... H01L 21/7681 257/E21.507 |
| 6,271,141 | B2 * | 8/2001 | Juengling ............. 257/E21.245 |
| 6,319,814 | B1 * | 11/2001 | Tsai et al. ...................... 438/624 |
| 6,331,479 | B1 * | 12/2001 | Li et al. .......................... 438/618 |
| 6,383,913 | B1 * | 5/2002 | Tsai et al. ...................... 438/624 |
| 6,391,795 | B1 * | 5/2002 | Catabay et al. ............... 438/763 |
| 6,400,030 | B1 * | 6/2002 | Wang ................. H01L 21/76897 257/774 |
| 6,417,094 | B1 * | 7/2002 | Zhao ................. H01L 21/76808 257/E21.579 |
| 6,475,929 | B1 * | 11/2002 | Gabriel et al. ................ 438/783 |
| 6,537,923 | B1 * | 3/2003 | Bhatt ................ H01L 21/31053 257/E21.244 |

(Continued)

*Primary Examiner* — Thao X Le
*Assistant Examiner* — Eric Jones
(74) *Attorney, Agent, or Firm* — Slater & Matsil, L.L.P.

(57) ABSTRACT

Methods of fabricating interconnect structures in a semiconductor integrated circuit (IC) are presented. A preferred embodiment comprises forming interconnect lines and vias through a dual-damascenes process. It includes forming a via dielectric layer, an etch stop layer directly over the via dielectric layer, and a trench dielectric layer over the etch stop layer. The etch stop layer is patterned through a first photolithography and etch process to form openings in the etch stop layer, prior to the formation of the trench dielectric layer. A second photolithography and etch process is performed after formation of the trench dielectric layer to create trench openings in the trench dielectric layer and via openings in the via dielectric layer, where the patterned etch stop layer acts as a hardmask in forming vias in the via dielectric layer.

21 Claims, 14 Drawing Sheets

(56) References Cited

U.S. PATENT DOCUMENTS

| | | | |
|---|---|---|---|
| 6,559,033 B1 * | 5/2003 | Hu | H01L 21/76264 257/E21.564 |
| 6,603,206 B2 * | 8/2003 | Wang | H01L 21/76808 257/774 |
| 6,876,079 B2 * | 4/2005 | Aoyama | H01L 21/28562 257/758 |
| 6,951,826 B2 * | 10/2005 | Bencher et al. | 438/761 |
| 6,989,603 B2 * | 1/2006 | Zhang | 257/774 |
| 7,056,646 B1 * | 6/2006 | Amblard et al. | 430/311 |
| 7,115,993 B2 * | 10/2006 | Wetzel et al. | 257/758 |
| 7,531,448 B2 | 5/2009 | Wang | |
| 7,811,930 B2 | 10/2010 | Wang | |
| 7,838,415 B2 | 11/2010 | Chang et al. | |
| 8,008,206 B2 | 8/2011 | Liang et al. | |
| 8,034,712 B2 | 10/2011 | Chang et al. | |
| 8,222,151 B2 | 7/2012 | Liang et al. | |
| 2002/0001952 A1 * | 1/2002 | Chooi et al. | 438/687 |
| 2002/0171147 A1 * | 11/2002 | Yew et al. | 257/751 |
| 2002/0175414 A1 * | 11/2002 | Teh et al. | 257/751 |
| 2004/0053501 A1 * | 3/2004 | Brennan et al. | 438/694 |
| 2004/0056359 A1 * | 3/2004 | Lee et al. | 257/758 |
| 2004/0152299 A1 * | 8/2004 | Mahalingam et al. | 438/637 |
| 2005/0017324 A1 * | 1/2005 | Yamamoto | 257/532 |
| 2005/0167839 A1 * | 8/2005 | Wetzel et al. | 257/758 |
| 2005/0233519 A1 * | 10/2005 | Chang et al. | 438/253 |
| 2005/0277302 A1 * | 12/2005 | Nguyen et al. | 438/763 |
| 2006/0006546 A1 * | 1/2006 | Colburn | H01L 21/76807 257/774 |
| 2006/0148192 A1 * | 7/2006 | Chou et al. | 438/396 |
| 2006/0292854 A1 | 12/2006 | Wang | |
| 2007/0077780 A1 * | 4/2007 | Wang et al. | 438/780 |
| 2008/0171434 A1 | 7/2008 | Chang et al. | |
| 2008/0318414 A1 * | 12/2008 | Jeong | 438/637 |
| 2009/0176378 A1 | 7/2009 | Wang | |
| 2011/0021021 A1 | 1/2011 | Chang et al. | |
| 2012/0100717 A1 | 4/2012 | Lii et al. | |
| 2013/0270709 A1 | 10/2013 | Tseng et al. | |
| 2014/0300000 A1 | 10/2014 | Chao et al. | |

* cited by examiner

METHOD FOR FORMING INTERCONNECT STRUCTURES

TECHNICAL FIELD

The present invention relates generally to forming interconnect structures in very-large-scale semiconductor integrated (VLSI) circuits and more particularly to forming interconnect structures through a self-aligned dual damascene process.

BACKGROUND

Dual damascene interconnect structures are a well known choice for interconnecting semiconductor devices in an integrated circuit (IC) for high speed and reliable signal transmission, particularly as device feature sizes in ICs continue to scale down. It involves formation of inlaid metal lines in trenches and vias formed in a dielectric layer. Forming dual damascene interconnect structures requires fewer processing steps than other methods and offers a higher yield and reliability. It is also particularly well-suited to metals such as copper (Cu) that provides a desired conductivity, but is difficult to be patterned by a plasma etching and prone to diffusing into inter-metal dielectric layers and silicon to degrade device performance. FIGS. 1A-1G are cross sectional views illustrating an exemplary dual damascene process for forming interconnect structures in a partially fabricated IC.

FIG. 1A illustrates a representative starting substrate 10 used for a dual damascene process. Substrate 10 includes a dielectric layer 13 (such as silicon dioxide or organic-containing low-k materials) with etched line patterns (trenches and vias). Dielectric layer 13 may be an inter-layer dielectric (ILD) layer on a semiconductor substrate, e.g., silicon, or an inter-metal dielectric layer (IMD) over another dielectric layer with an underlying interconnect level. Dielectric layer 13 has been inlaid with interconnect copper lines 17 that are generally formed to provide electrical coupling between conductive features in an underlying interconnect layer and in an overlying interconnect layer.

Shown in FIG. 1B, a diffusion barrier layer 19 is formed over the substrate, preventing underlying copper from diffusing into the dielectric and silicon. Next, a via dielectric layer 14 of bilayer dielectric structure 20 is deposited on diffusion barrier layer 19. This is followed by deposition of an etch-stop layer 21 on via dielectric layer 14. The process continues where trench dielectric layer 16 of bilayer dielectric structure 20 is deposited, in a similar manner to via dielectric layer 14, onto etch-stop layer 21. An antireflective layer 23 is subsequently deposited to the top of trench dielectric layer 16. Portions of trench dielectric layer 16 and via dielectric layer 14 are then etched away where the interconnect lines and vias are required, antireflective layer 23 facilitates the photolithographic process used to form the etch patterns.

Continuing in FIG. 1C, bilayer dielectric structure 20 is subjected to a photolithography and etching process to form openings for metal lines. In a well-known "Via-First" approach, first photolithography and etching processing is applied on the structure, a photoresist is coated on the structure and lithographically exposed to form a pattern of vias. The pattern of vias is then developed in the photoresist, an anisotropic etching process is then applied to form via openings 25 in the bilayer dielectrics. The etching etches through trench dielectric layer 16, etch-stop layer 21, via dielectric layer 14, diffusion barrier layer 19, and stops on substrate 10.

Shown in FIG. 1D, second photolithography and etching processing is subsequently applied on the structure; the structure is coated with a photoresist and lithographically exposed to form a pattern of trenches. The pattern of trenches is then developed in the photoresist, an anisotropic etching process is then applied to cut trench openings 27. The etching of trench openings 27 is controlled such that etch-stop layer 21 is not penetrated. As a result, trenches openings 27 are etched in trench dielectric layer 16, and are connected to the previously formed via openings 25 in via dielectric layer 14 where electrical couplings to underlying interconnect level are required.

Illustrated in FIG. 1E, via and trench openings 25 and 27 are then filled with copper 35 utilizing conventional deposition processes known to those skilled in the art, including CVD, plasma-assisted CVD, sputtering, electroplating, etc. Dual damascene structure 20 is then planarized to remove excess copper from its top surface and to provide a flat surface for the subsequent processing steps. Typically, a conformal diffusion barrier layer is deposited in the etched via and trench openings 25, 27 prior to filling with copper 35; the diffusion barrier layer prevents copper from diffusing into the silicon and the ILD and IMD layers. Suitable materials for the diffusion barrier layer include tantalum, tantalum nitride, tungsten, titanium, titanium tungsten, titanium nitride, and the like.

Alternatively, via and trench openings 25 and 27 may also be formed through a known "Trench-First" approach, where trench openings 27 are patterned and etched through first photolithography and etching processing, while via openings 25 are patterned and etched through second photolithography and etching processing, among other similar processing steps.

As the critical dimensions of semiconductor devices get smaller, generally both the patterned via and trench openings get narrower and deeper, i.e., the aspect ratio of the via and trench openings increases significantly. Also, in advanced process nodes, e.g., 45 nm and beyond, the narrowed line width of trench openings is getting close to the line width of via openings in order to accommodate the significantly increased routing requirements. The trend imposes serious challenges on the existing dual damascene structure formation approach in at least the following aspects.

First, due to the significantly increased metal line density, the via and trench pattern alignment involved in the existing dual photolithography and etch processing cycle becomes more difficult and error-prone; a slight misalignment between the via and trench patterns may result in opens and shorts in the dual damascene structure, leading to significant yield loss and reliability concerns. As an example, FIG. 1F illustrates a scenario where the trench pattern is misaligned with a via pattern, causing undesired metal bridges and opens between copper lines and vias.

Second, an increased via and trench opening aspect ratio in a dual damascene structure may deactivate an existing photolithography approach in that the photolithography processes currently used in the formation of a dual damascene structure typically require filling ashable resist deposition (ARD) materials, such as amorphous carbon (APF), in the etch openings after a first photolithography and etching process cycle, and prior to a second photolithography and etching process cycle. The increased via and trench opening aspect ratio in advanced process nodes may result in voids in unfilled or partially-filled etch openings, and undesirable surface step height, among other detrimental effects, thus significantly complicating or invalidating an existing ARD filling operation.

SUMMARY OF THE INVENTION

These and other problems are generally solved or circumvented, and technical advantages are generally achieved, by preferred embodiments of the present invention which provide methods of fabricating interconnect structures in a semiconductor integrated circuit (IC).

In accordance with a preferred embodiment of the present invention, a method for forming an interconnect structure in an integrated circuit (IC) comprises forming a via dielectric layer on a surface of a substrate, forming an etch stop layer directly atop the via dielectric layer, patterning the etch stop layer to form openings through the etch stop layer, forming a trench dielectric layer over the patterned etch stop layer, forming trench openings in the trench dielectric layer overlying the openings in etch stop layer, and forming via openings in the via dielectric layer through the openings of the trench dielectric layer and the etch stop layer.

In accordance with another preferred embodiment of the present invention, a method for forming an interconnect structure in an integrated circuit (IC) comprises forming a first dielectric layer on a substrate, forming an etch stop layer directly atop the first dielectric layer, using a first photolithography process to form patterned openings through the etch stop layer, forming a second dielectric layer directly on the etch stop layer, using a second photolithography process to form patterned trench openings in the second dielectric layer and aligned with the openings in the etch stop layer, and forming via openings in the first dielectric layer using the patterned etch stop layer as a hard-mask.

Advantageous features of different embodiments include the following. Firstly, the formation of trench and via openings is performed through a single photolithography and etching process cycle. Alignment between a via mask layer and a trench mask layer as required by the prior art dual damascene approach is not necessary. This may eliminate the metal bridges/opens problem due to the misalignment of a via and a trench photomask. Secondly, the approach of forming the interconnect structures in preferred embodiments does not involve consecutive photolithography-etch cycles as used in the existing dual damascene process, thus the problem of filling anti-reflective materials (e.g., ARD) in narrow, high-aspect-ratio etch openings may be avoided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely self-aligned dual damascene interconnection structure formation. Various embodiments etch high-aspect-ratio trench and via openings through a single anisotropic etch process using a pre-formed, pre-patterned barrier layer between the via and trench dielectrics as a self-aligned hard mask for the etching of via openings. The preferred embodiments enable improved trench and via alignment useful in advanced technology nodes. The preferred embodiments also provide solutions for the challenges in filling high-aspect-ratio trench and via openings typically encountered in existing dual damascene manufacturing methods.

Figure 1A:
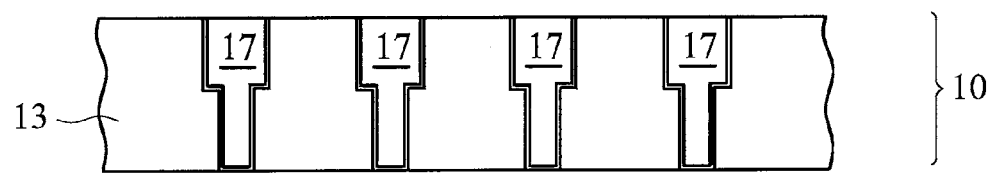
FIGS. 1A-1F are cross sectional views of an interconnect structure fabricated through an existing dual damascene process.
Figure 1B:
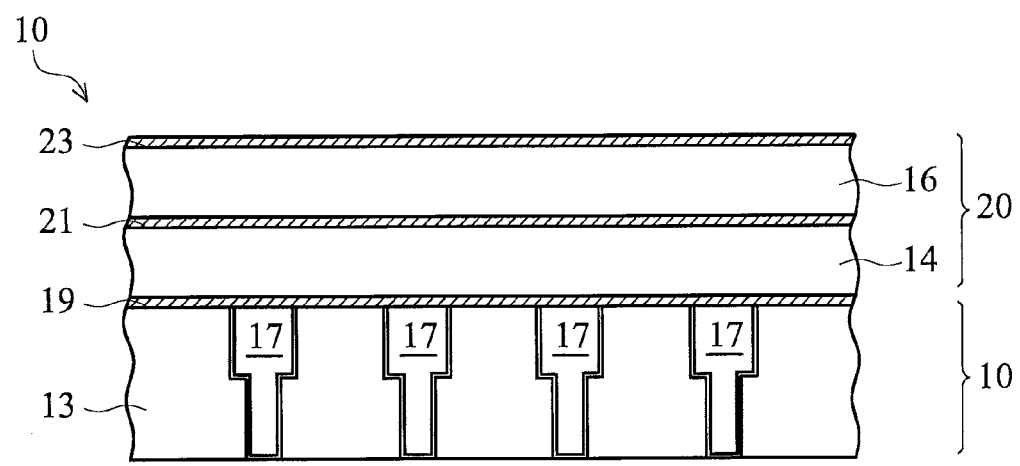
Figure 1C:
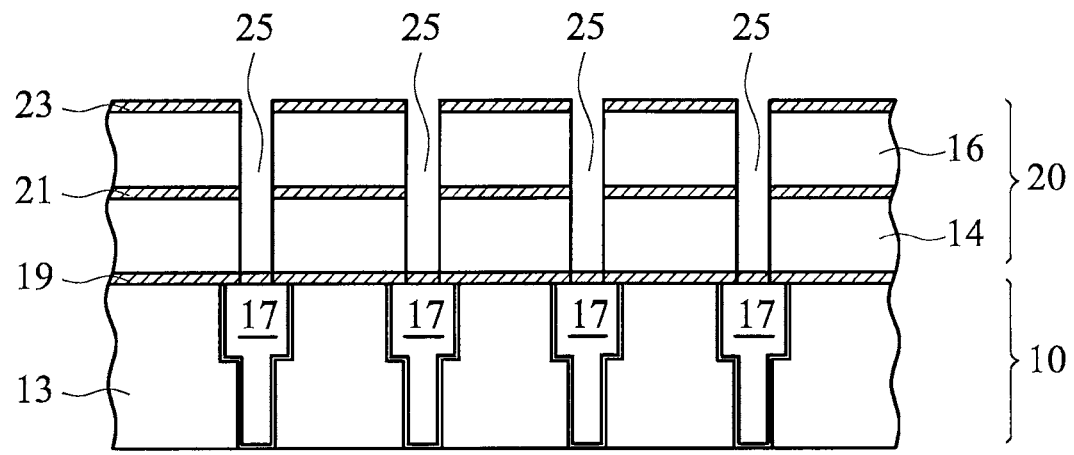
Figure 1D:
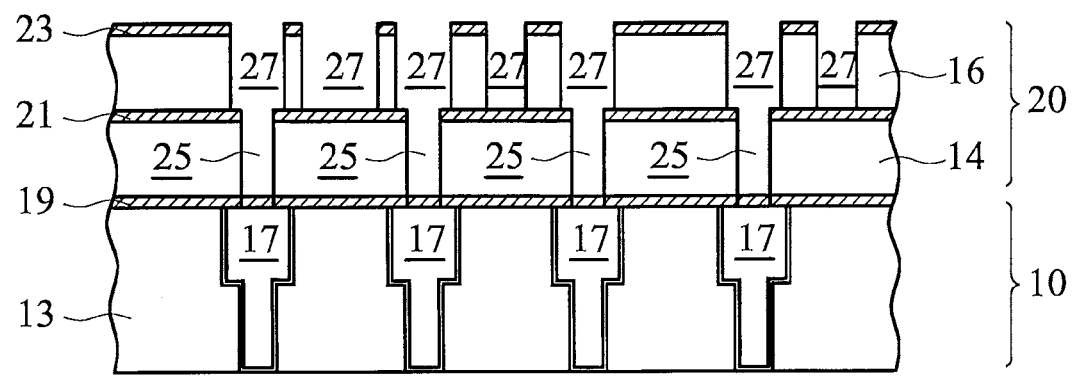
Figure 1E:
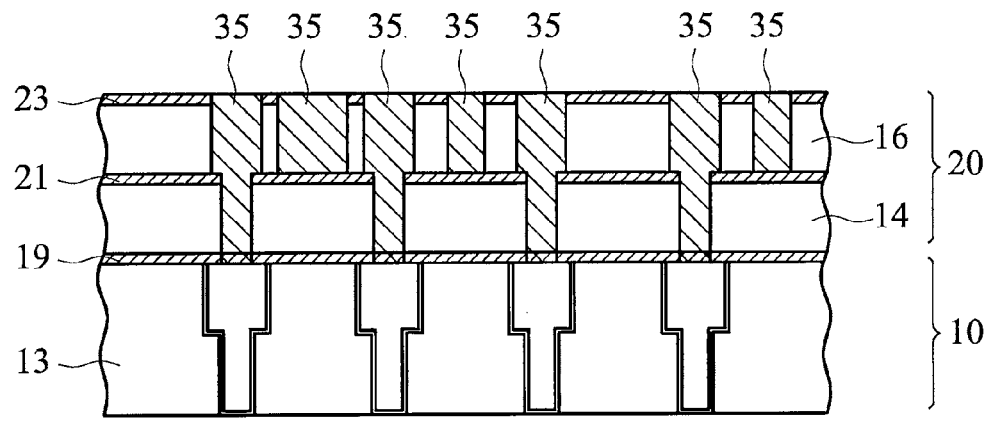
Figure 1F:
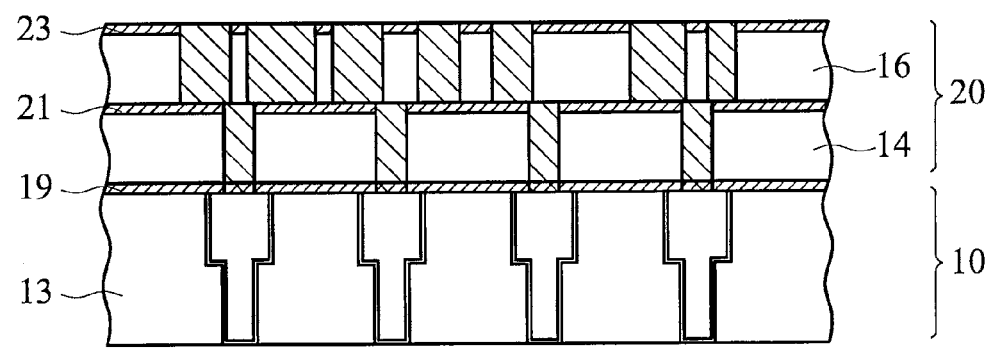
Figure 2A:
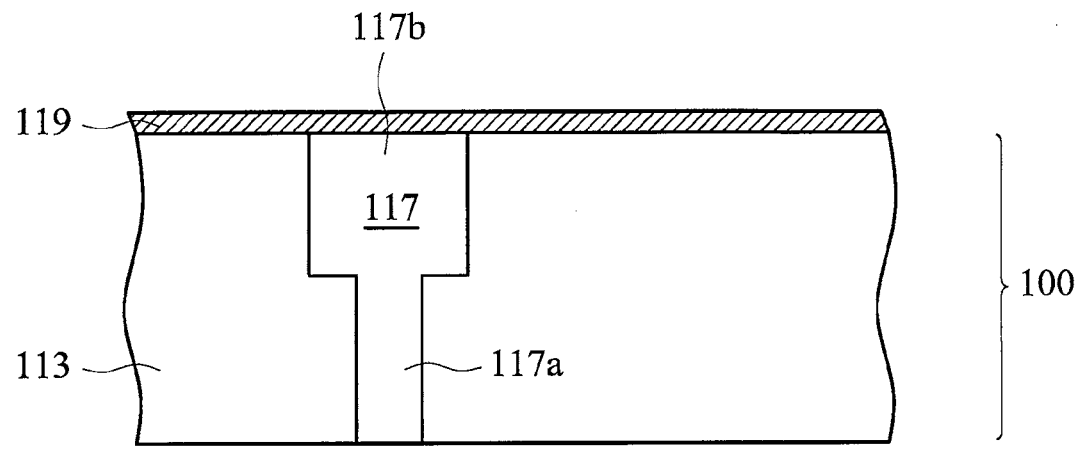
FIGS. 2A-2E are cross sectional views of one preferred embodiment through various intermediate processing steps.

FIG. 2A shows a representative starting substrate 100 used for a dual damascene process in preferred embodiments. Substrate 100 comprises ILD or IMD layer 113 embedded with interconnect conducting structure 117. In one preferred embodiment, interconnect structure 117 comprises via/contact portion 117a and line portion 117b. Via/contact portion 117a may be coupled to an underlying interconnect layer or a semiconductor substrate; line portion 117b may have a dimension similar to that of 117a in an advanced technology node. To simplify description, only one interconnect structure 117 is shown, but in reality, a plurality of interconnect structures 117 are formed and inlaid in ILD or IMD layer 113. Typical metals for interconnect structure 117 include aluminum, copper, and tungsten, and the like. Diffusion barrier layer 119 is formed over substrate 100, preventing underlying interconnect structure 117 materials from diffusing into the dielectric and silicon. Diffusion barrier layer 119 may also comprise an adhesion promoting layer on the top or the bottom surface. Suitable materials for diffusion barrier layer 119 include silicon nitride (SiN), silicon oxynitride (SiON), silicon carbon nitride (SiCN), and the like. In a typical process, diffusion barrier layer 119 is formed by a physical vapor deposition (PVD) process such as sputtering or by a chemical vapor deposition (CVD) process. While "substrate 100" is used to refer to the starting workpiece of a preferred embodiment, from hereafter, the terms "substrate" and "wafer substrate" are interchangeably used to refer to a finished wafer surface after an intermediate process step in a preferred embodiment.

Figure 2B:
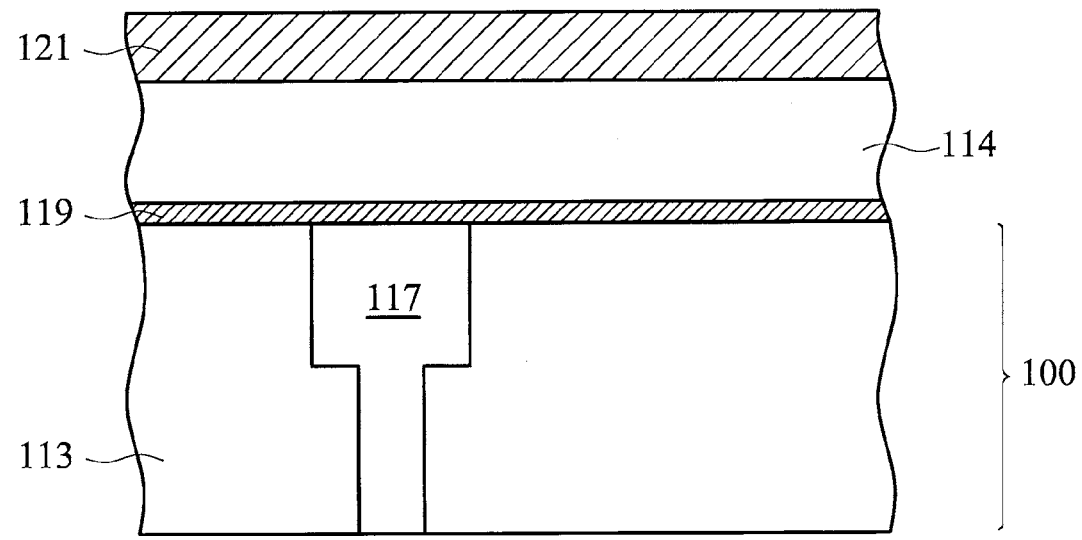

Shown in FIG. 2B, via dielectric layer 114 is deposited on diffusion barrier layer 119. In one preferred embodiment, via dielectric layer 114 comprises a CVD silicon dioxide ($SiO_2$) layer, e.g., undoped silica glass (USG), having a thickness of from about 1500 Å to about 3000 Å formed by a plasma enhanced chemical vapor deposition (PECVD) process. In another preferred embodiment, via dielectric layer 114 comprises one or more low-k dielectric materials (a dielectric constant of about 3.5 or less), such as organic silicate glass (OSG), porous methylsilsesquioxane (p-MSQ), hydrogen silsesquioxane (HSQ), and the like, formed by suitable deposition processes. This is followed by deposition of etch stop layer 121 on via dielectric layer 114. In the current embodiment, etch stop layer 121 may comprise silicon nitride (SiN), silicon oxynitride (SiON), silicon carbon nitride (SiCN), and the like, having a thickness of about 600 Å formed by a PECVD process, although other suitable processes can be also used.

Figure 2C:
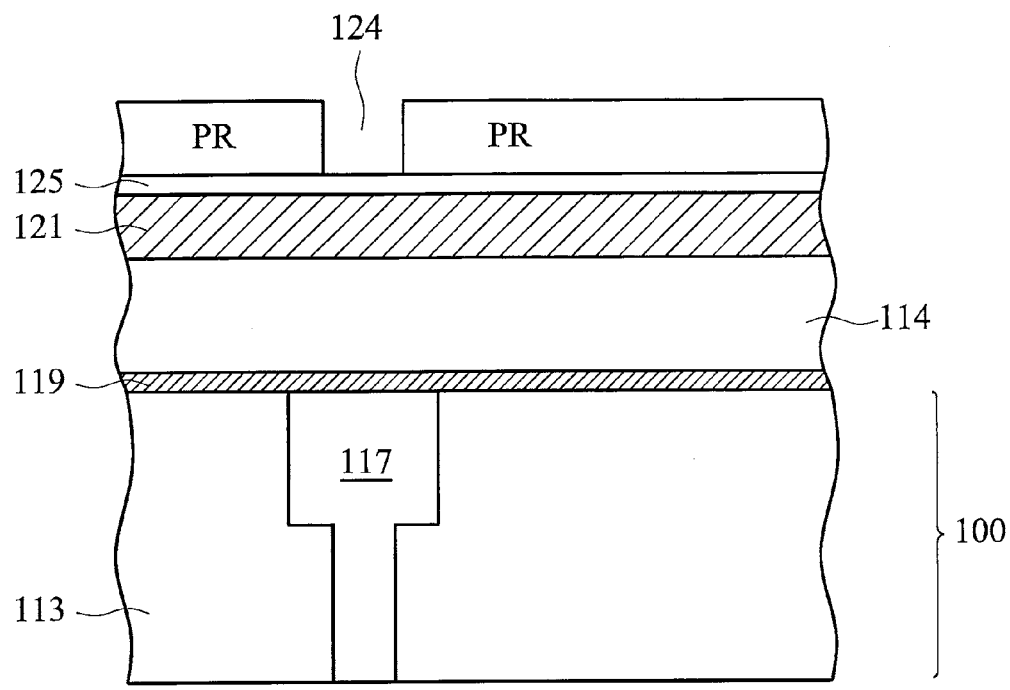

The process continues in FIG. 2C, where first photolithography and etching processing is applied to the substrate to form openings in etch stop layer 121. Prior to the first photolithography process, anti-reflective coating (BARC) 125 is preferably formed on the substrate surface to facilitate the lithography. A photoresist (PR) is coated on the substrate and lithographically exposed to form a pattern similar to the pattern of vias to be formed in later processing steps; the pattern is then developed in the photoresist. It is noted that, in one preferred embodiment, the dimensions of pattern openings 124 to be developed at the current process step are substantially the same as those of the via pattern. In another preferred embodiment, the dimensions of the registered pattern openings 124 are larger than those of the vias. In one preferred embodiment, a 193 nm immersion lithography system such as the XT 1700i is used to create the pattern in the nanometer range, e.g., 32-90 nm critical dimensions (CD) with a pitch size equal or less than twice the CD.

Figure 2D:
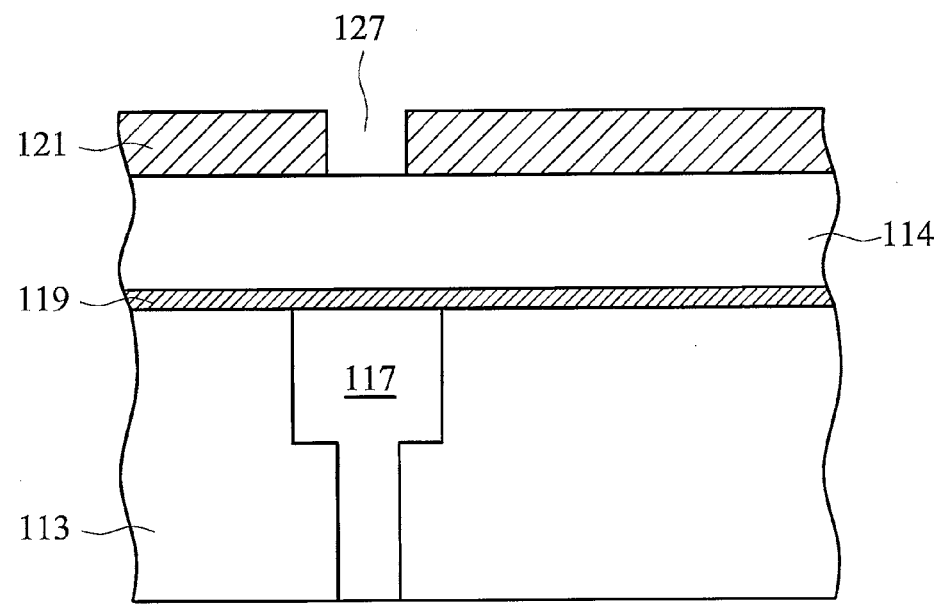

Depicted in FIG. 2D, an anisotropic etching process is then applied to the substrate to etch openings 127 in etch stop layer 121, and stops on via dielectric layer 114. In one preferred embodiment, existing SiN, SiON, SiCN etch recipes are used to create openings 127 over USG 114. A slight over etch is preferably performed to assure complete removal of etch stop layer 121 at openings 127. When the etch process is completed, an etch pattern similar to the via pattern is formed in etch stop layer 121. In one preferred embodiment, etch pattern opening 127 has a dimension substantially the same as that of a via dimension. An existing via photomask is used to form etch pattern opening 127, the result being a hard-mask of the via pattern in etch stop layer 121. In another preferred embodiment, etch pattern opening 127 has a dimension larger than a corresponding via dimension with a margin of about 10-50 percent on each side with the actual margin dependent upon the technology node, design rule and application. For example, in an advanced process node with a via CD of 45 nm, the corresponding etch stop layer opening 127 has a dimension of about 70 nm, having a margin of about 12.5 nm on each side of a via opening. From hereafter, etch stop layer 121 with etched pattern 127 is also referred to as hard-mask 121. Next, a plasma ashing process may be applied to remove BARC material 125 left on the wafer substrate.

Figure 2E:
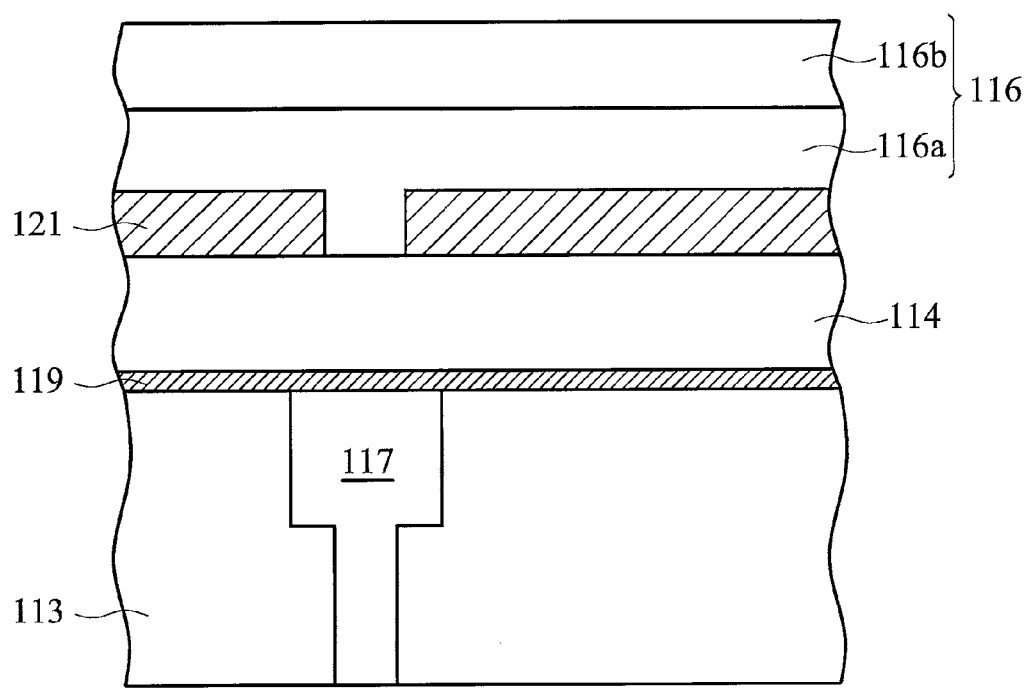

Shown in FIG. 2E, trench dielectric layer 116 is then deposited on the wafer substrate, covering etch stop layer 121 and filling etch stop layer openings 127. In one preferred embodiment, trench dielectric layer 116 comprises a CVD silicon dioxide ($SiO_2$) layer having a thickness of from about 2000 Å to about 4000 Å. In another preferred embodiment, trench dielectric layer 116 comprises one or more low-k dielectric materials, such as organic silicate glass (OSG), porous methylsilsesquioxane (p-MSQ), hydrogen silsesquioxane (HSQ), and the like, formed by suitable deposition processes. Regardless of the materials and processes used, trench dielectric layer 116 preferably exhibits at least the following characteristics: a substantially void-free filling of etch stop layer openings 127 and a substantially flat substrate surface after trench dielectric layer 116 deposition. These characteristics are desirable for process integration, device reliability, and product yield, among others.

In cases where silicon oxide is used as trench dielectric layer 116, various CVD techniques can be adopted to form silicon oxide. In one preferred embodiment, trench oxide layer 116 is deposited using PECVD at a temperature range of between about 300° C. to about 500° C. Feed gases include a mixture containing $SiH_4$ at a flow rate range of between about 30 sccm and 3000 sccm, $N_2O$ at a flow rate range of between about 30 sccm and 3000 sccm, with the actual gas flow amount dependent upon the application and the wafer size.

Instead of using PECVD, trench oxide layer 116 can also be deposited using high density plasma (HDP) chemical vapor deposition process at a temperature range of between about 350° C. to about 700° C., with an RF power in a range of between about 1000 W to about 10000 W. Feed gases include $SiH_4$ at a flow rate range of between about 30 sccm and 3000 sccm, $O_2$ at a flow rate range of between about 30 sccm and 3000 sccm. HDP chemical vapor deposition processes typically operate at a pressure range several (two to three) orders of magnitude lower than corresponding PECVD processes (i.e., in the milliTorr range). Moreover, in an HDP reactor, power is coupled inductively, instead of capacitively, to the plasma, resulting in higher plasma density. Consequently, in an HDP reactor, because of the pressure and plasma characteristics, the atoms impinging on the depositing film surface are much more energetic than in a PECVD reactor, such that gas-solid collisions may result in sputtering of the deposited film. The differences in the physics and chemistry of PECVD and HDP processes result in significant differences in the growth of the deposited film. For example, silicon oxide film 116 formed by a PECVD deposition process results in a flatter surface topology, while an HDP silicon oxide deposition process exhibits a better filling capability.

In one preferred embodiment of the current invention, trench oxide layer 116 has a bi-layer configuration formed through a multiple-step CVD process flow. An HDP chemical vapor deposition process is performed to deposit a first trench silicon oxide layer 116a having a thickness of from about 1000 Å to about 2000 Å, with the actual film thickness dependent upon the application and the wafer size. The HDP chemical vapor deposition process is performed at a temperature range of between about 350° C. to about 700° C., with an RF power in a range of between about 1000 W to about 10000 W. Feed gases include $SiH_4$ at a flow rate range of between about 30 sccm and 3000 sccm, $O_2$ at a flow rate range of between about 30 sccm and 3000 sccm. Subsequently, a PECVD process is performed to deposit a second trench silicon oxide layer 116b having a thickness of from about 1000 Å to about 2000 Å in a same or different CVD processing chamber, with the actual film thickness dependent upon the application and the wafer size. The multiple-step CVD process flow described above results in trench oxide layer 116 with the desirable characteristics of substantially void-free filling in etch stop layer openings 127 and a substantially flat post-deposition substrate surface.

In another preferred embodiment, trench dielectric layer 116 has a bi-layer configuration similar to the one described above. Unlike the second trench dielectric layer 116b made of silicon dioxide, second trench dielectric layer 116b in the current embodiment comprises one or more low-k dielectric materials, such as organic silicate glass (OSG), porous methylsilsesquioxane (p-MSQ), hydrogen silsesquioxane (HSQ), and the like, formed by suitable deposition processes, such as a PECVD process. Low-k dielectric materials are known to reduce inter/intra-metal layer capacitance, which in turn reduces signal RC delays and enhances signal integrity; thus, the current embodiment is suitable for high-speed, logic VLSI products.

In a further preferred embodiment, a planarization process is performed on the wafer substrate after the HDP deposition of first trench silicon oxide layer 116a, but prior to the PECVD deposition of the second dielectric layer 116b of silicon oxide, low-k material, or other suitable dielectric materials. This approach may achieve the desired high degree of trench dielectric layer surface planarization. An exemplary planarization process is described below.

Figure 3A:
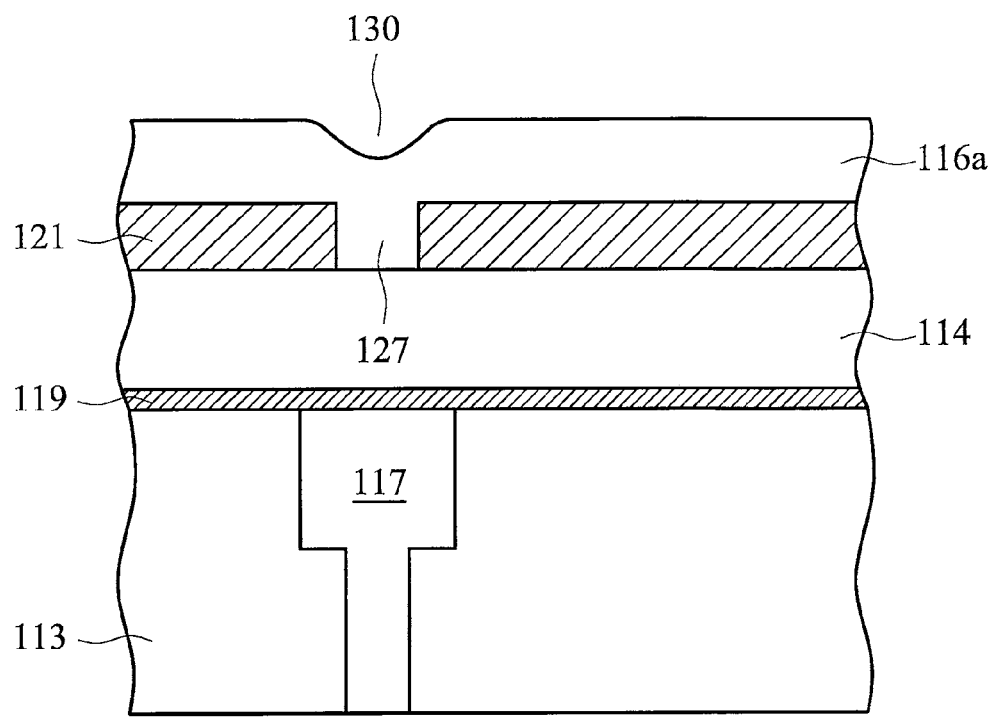
FIGS. 3A-3D illustrate the cross sectional views through intermediate processing steps involving an etch-back process in one preferred embodiment.
Figure 3B:
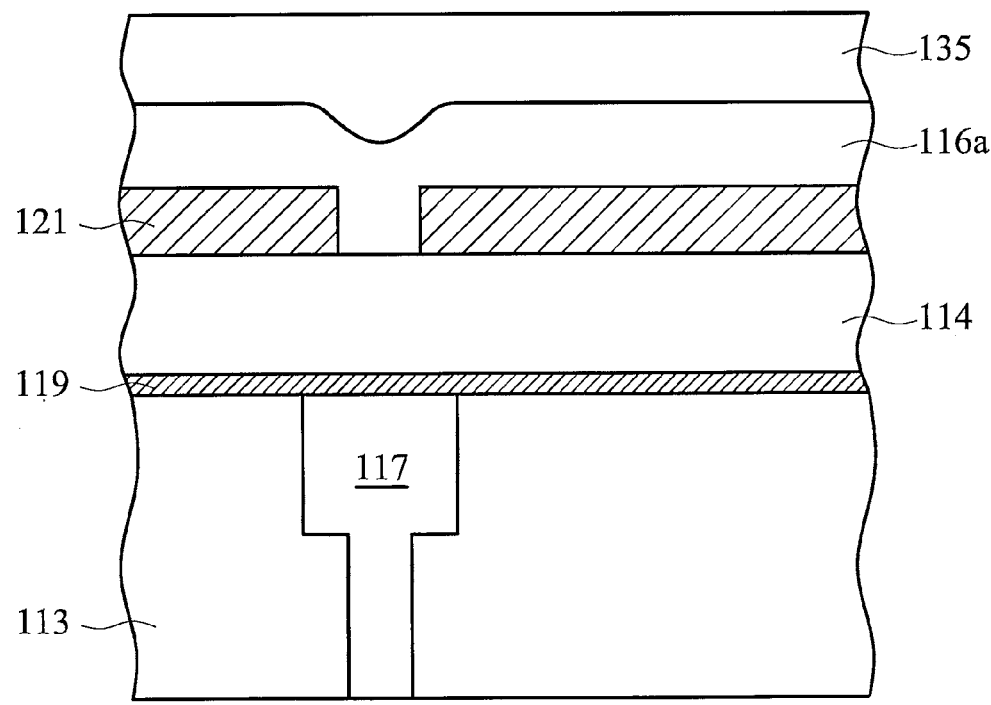
Figure 3C:
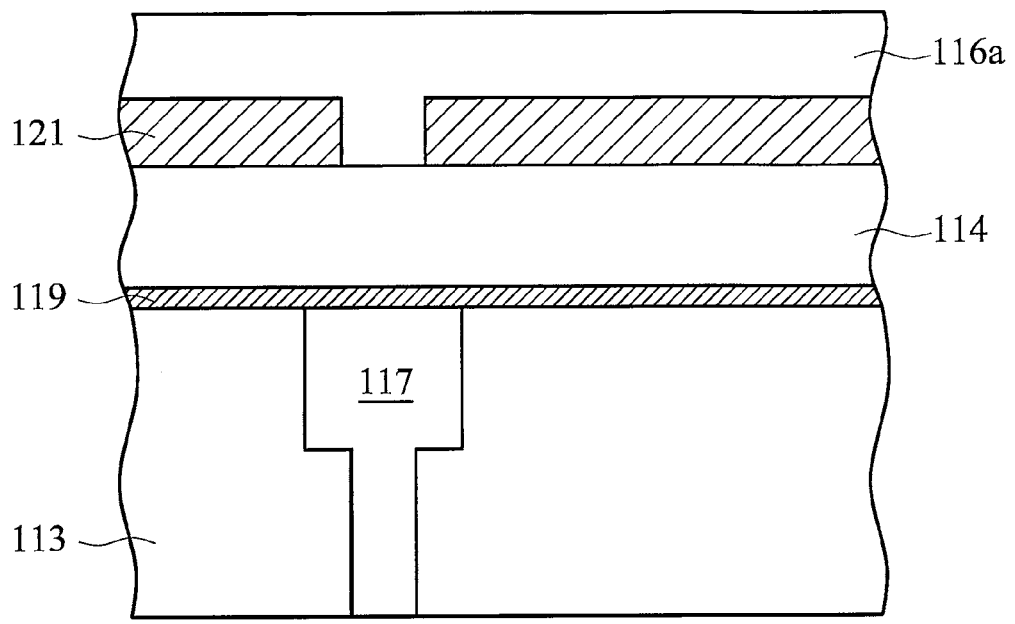

FIG. 3A illustrates a wafer substrate where first trench silicon oxide layer 116a having a thickness of from about 1000 Å to about 2000 Å is deposited through an HDP chemical vapor deposition process, as described with respect to FIG. 2E. Due to the process characteristics of HDP silicon oxide deposition, layer 116a exhibits a substantially void-free filling of etch stop layer openings 127, but leaves undesirable step height 130 on the surface. The surface planarization process starts by coating one or more sacrificial layers 135, which are typically low-viscosity liquids, such as photoresists, polymide, and spin-on-glass (SOG). The wafer substrate is then baked, the liquids turn to solid thin films that are thick enough to produce a substantially flat surface, as shown in FIG. 3B. Sacrificial layer 135 is then etched back by typically a plasma etch process until all of sacrificial layer 135 and part of layer 116a is etched away, leaving a substantially flat surface desirable for the deposition of the second dielectric layer 116b of silicon oxide, low-k material, or other suitable dielectric materials, as illustrated in FIG. 3C.

Figure 3D:
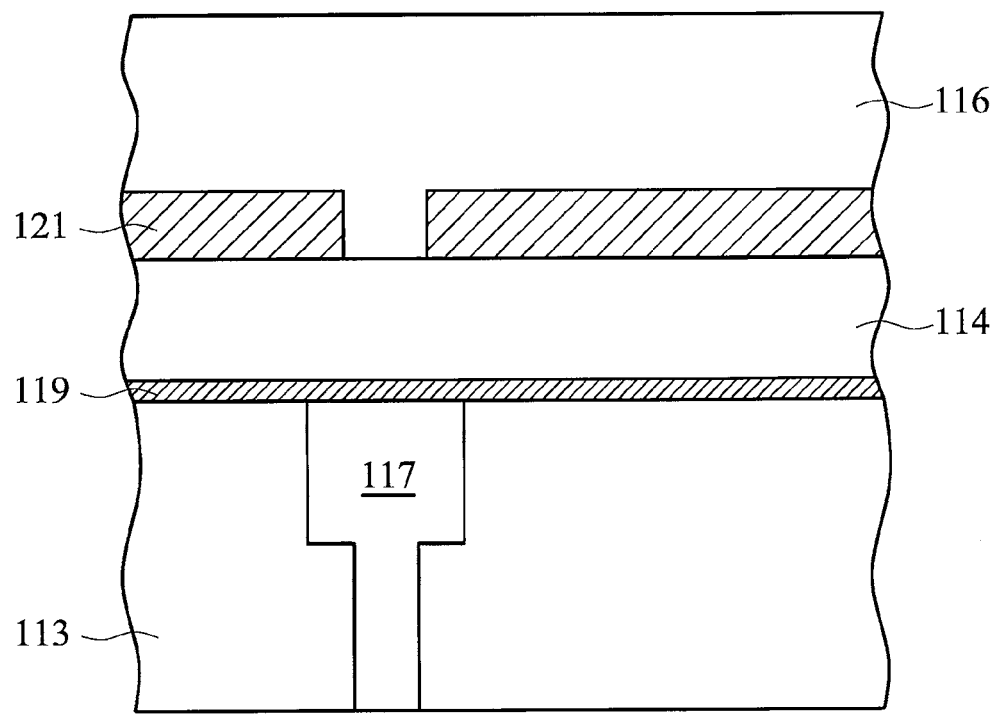

In an additional or alternative preferred embodiment, upon the completion of the formation of trench dielectric layer 116 having either a single or multiple-layers configurations as described above, an additional surface planarization process, typically a chemical-mechanical polishing process (CMP), is performed on the wafer substrate to produce a substantially flat wafer surface beneficial for the subsequent processing steps, as shown in FIG. 3D.

Figure 4A:
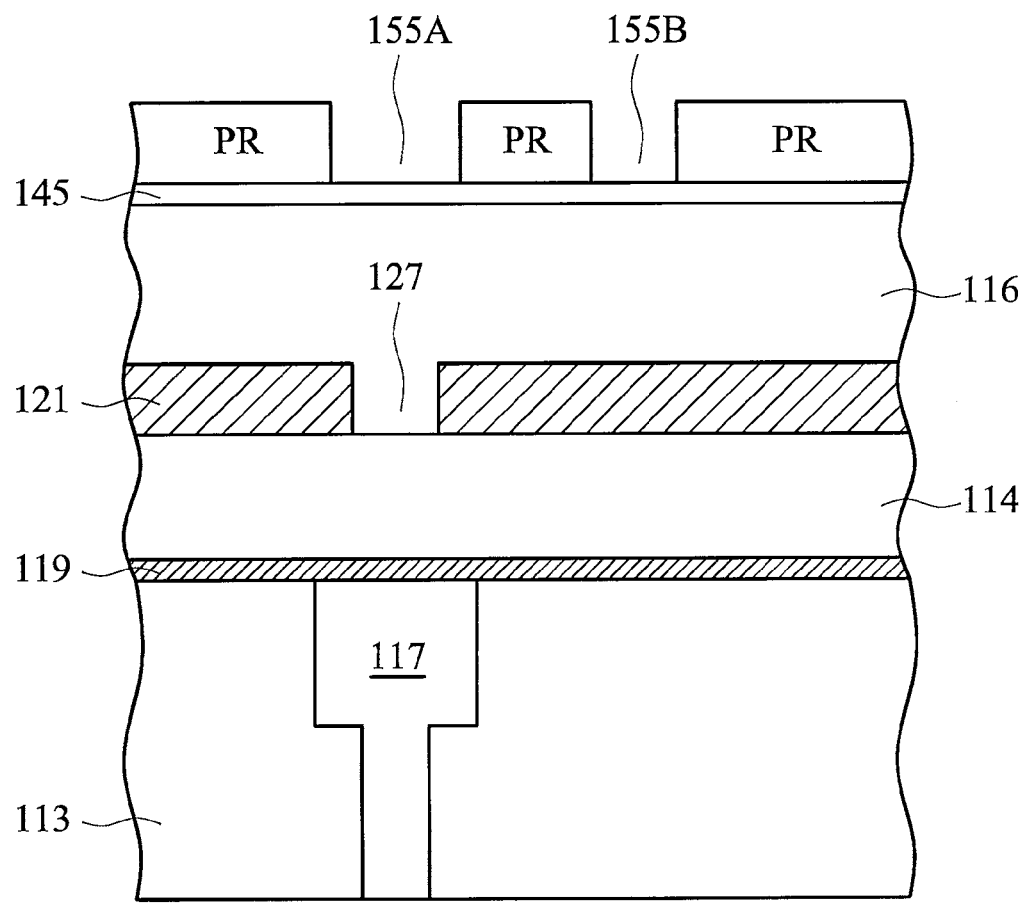
FIGS. 4A-4F illustrate cross sectional views of one preferred embodiment through various processing steps.

Continuing in FIG. 4A, where second photolithography and etching processing is applied to the wafer substrate to form openings for line patterns in trench dielectric layer 116 and via dielectric layer 114, and more specifically, line patterns 155A for forming dual damascene interconnect structure comprising an interconnect line in trench dielectric layer 116 overlying a via in via dielectric layer 114, and line patterns 155B for forming single damascene interconnect structure comprising interconnect lines in trench dielectric layer 116. Again, in one preferred embodiment, a 193 nm immersion lithography system such as the XT 1700i is used to create the pattern 155A and 155B in the nanometer range, e.g., 32-90 nm critical dimensions (CD) with a pitch size equal or less than twice the CD. Anti-reflective coating 145 is first formed on the substrate surface to facilitate the lithography. A photoresist (PR) is then coated on the substrate and lithographically exposed to form patterns 155A and 155B; the pattern is then developed in the photoresist. In one preferred embodiment, pattern 155A to be developed at the current process step has a dimension larger than that of a via, and the patterned etch stop layer 121 is a hard-mask version of the via pattern. In another preferred embodiment, pattern 155A is the via pattern, and openings 127 on the previously created hard-mask 121 have dimensions larger than that of a via. The photomask for patterns 155A and 155B is center-aligned with hard-mask 121 with a 10-50% side margin. In the example illustrated with respect to FIG. 2D, the via CD is about 45 nm, while openings 127 on hard-mask 121 has a CD of about 70 nm, leaving an approximately 50% side margin.

Figure 4B:
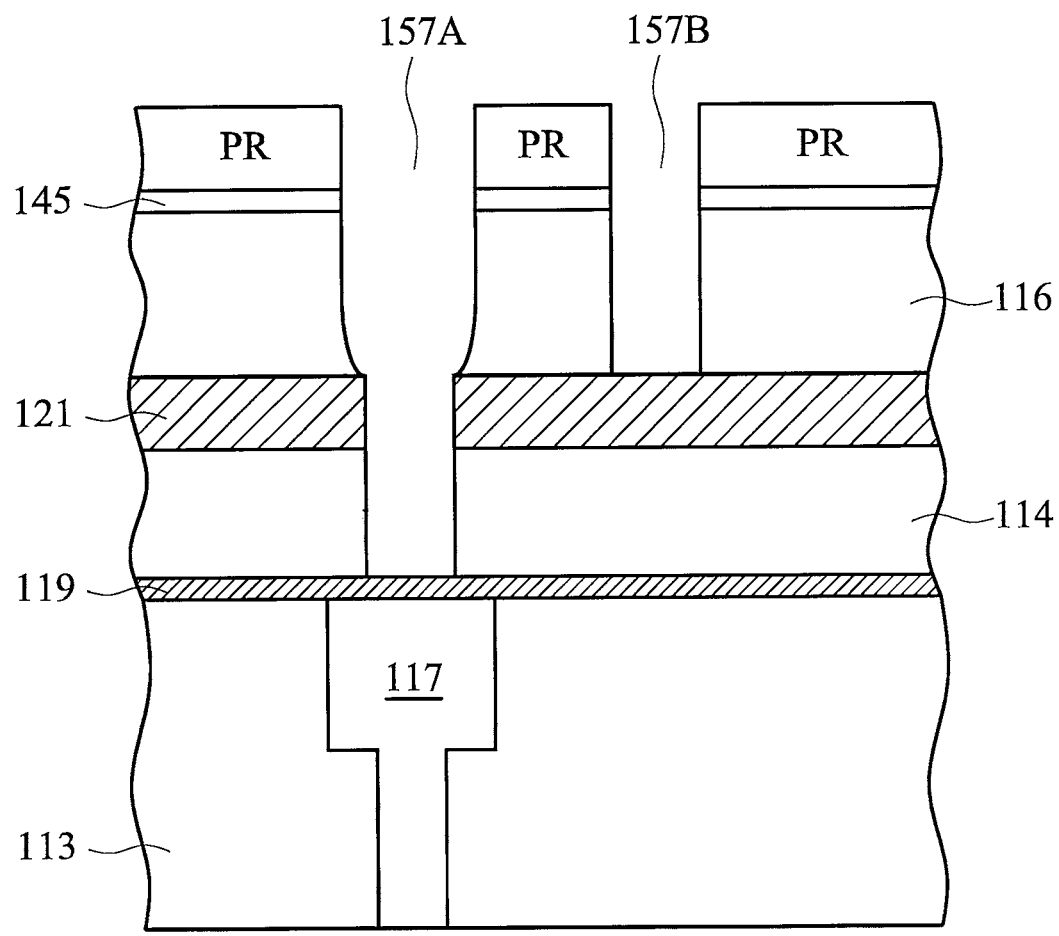

Next, an anisotropic etching process is then applied to the wafer substrate. As shown in FIG. 4B, the etch process first cuts through anti-reflective coating 145 and trench dielectric layer 116. The etch process stops on etch stop layer 121 where only interconnect lines in trench dielectric layer 116 are required, and it proceeds in via dielectric layer 114 where interconnect lines over vias inlaid in via dielectric layer 114 are required. This process is performed with patterned etch stop layer 121 acting as a hard-mask for the etching process in via dielectric layer 114. The etch process continues in via dielectric layer 114, cuts through diffusion barrier layer 119, and stops on underlying interconnect structure 117. A slight over etch is preferably performed to assure complete exposure of interconnect structure 117. When the etch process is completed, the trench and via portions of opening of 157A are simultaneously formed in a single etch process and self-aligned. Also, trench/via openings 157A for creating dual damascene interconnect structure and trench openings 157B for creating single damascene interconnect structure are simultaneously formed.

Figure 4C:
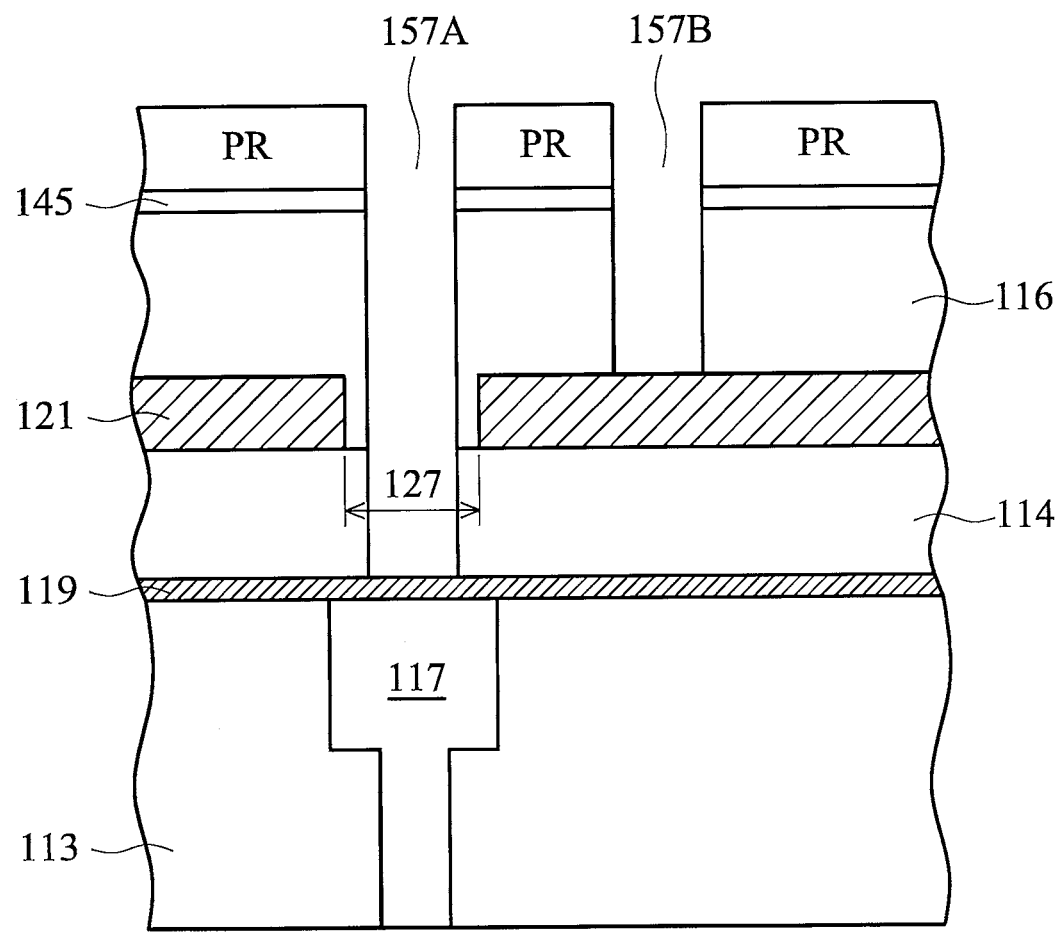

FIG. 4B illustrates a post-etch profile from one preferred embodiment where opening 157A has a dimension larger than that of a via, and the patterned etch stop layer 121 is a hard-mask version of the via pattern. FIG. 4C illustrates a post-etch profile from another preferred embodiment where opening 157A has a dimension substantially similar to a via, and openings 127 on the previously created hard-mask 121 have dimensions larger than that of a via pattern. In either embodiment, a misalignment between line patterns 157A and 157B, and hard-mask 121 within a predefined margin generally will not create shorts or opens between adjacent interconnect features. This may lead to an increased processing window for forming dual damascene interconnect structures in advanced technology nodes.

Figure 4D:
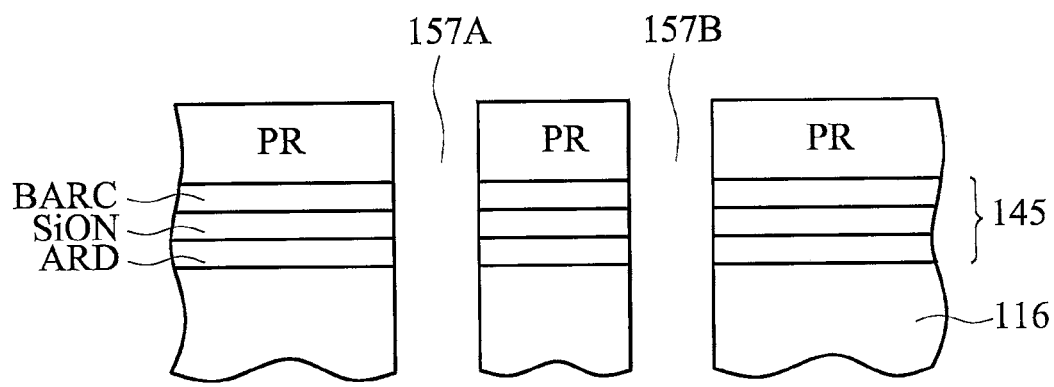

In another preferred embodiment, anti-reflective coating 145 has a BARC-SiON-ARD (e.g., amorphous carbon) configuration, one coated on top of the other as shown in FIG. 4D. In the current embodiment, the etch process may comprise multiple etch steps. For example, a first etch step may use the PR pattern as a mask to etch BARC, a second etch step may use the BARC pattern from last etch step as a mask to etch SiON, and a third etch may use the SiON pattern as a mask to etch ARD, and so on. These etch steps are typically performed in situ in preferred embodiments, and serve the purpose of transferring nanometer-range etch patterns from a photomask to the wafer substrate with desired precision.

Figure 4E:
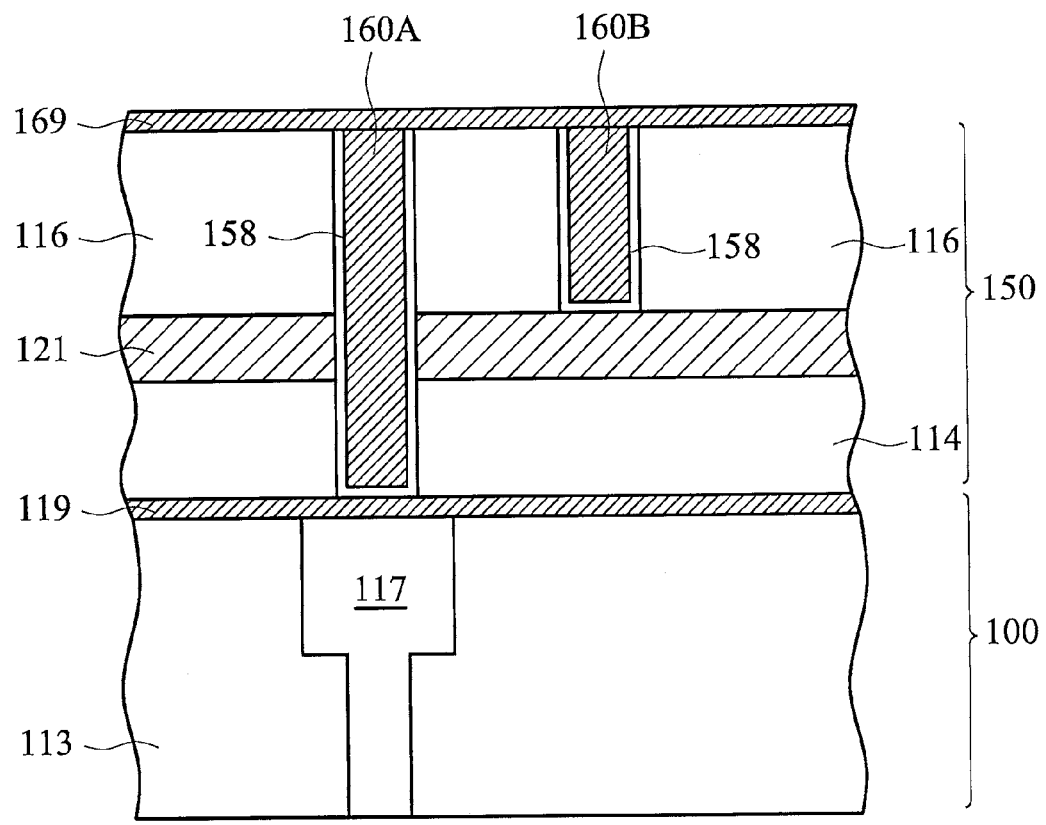

Proceeding in FIG. 4E, a plasma ashing process may be applied to remove photoresist PR and/or anti-reflective coating 145 on the wafer. Trench/via openings 157A and trench openings 157B are then filled with conductive metal desirable for interconnect structure in an IC. The metal is preferably selected from the group consisting of aluminum (Al), copper (Cu), silver (Ag), tungsten (W), and alloys thereof, although other conductive materials, such as other metals or conductive ceramics are also within the contemplated scope of the invention. The conductor is filled in the openings utilizing conventional deposition processes known to those skilled in the art, including CVD, plasma-assisted CVD, sputtering, electroplating, etc. In one preferred embodiment, copper is filled utilizing conventional deposition processes known to those skilled in the art, including CVD, PECVD, sputtering, electroplating, etc., forming trench/via interconnect structure 160A and trench interconnect structure 160B. Structures 160A and 160B are then planarized to remove excess copper from the top surface and to provide a flat surface for the subsequent processing steps. Typically, a conformal diffusion barrier layer 158 is deposited in the etched trench/via and trench openings 157A, 157B prior to filling with copper; the diffusion barrier layer prevents copper from diffusing into the silicon and/or the ILD and IMD layers. Suitable materials for diffusion barrier layer 158 include tantalum, tantalum nitride, tungsten, titanium, titanium tungsten, titanium nitride, and the like. In another preferred embodiment, a copper seed layer (not shown) is coated over the diffusion barrier layer 158 prior to the structure being filled with copper, and ground flat with a CMP process. Diffusion barrier layer 169, similar to diffusion barrier layer 119, may be subsequently formed over the wafer substrate using similar dielectric materials and deposition processes, for preventing underlying interconnect structure 160A and 160B materials from diffusing into the dielectric and silicon. Up to this point, interconnect structure 150 of preferred embodiments is formed in one interconnect layer.

Figure 4F:
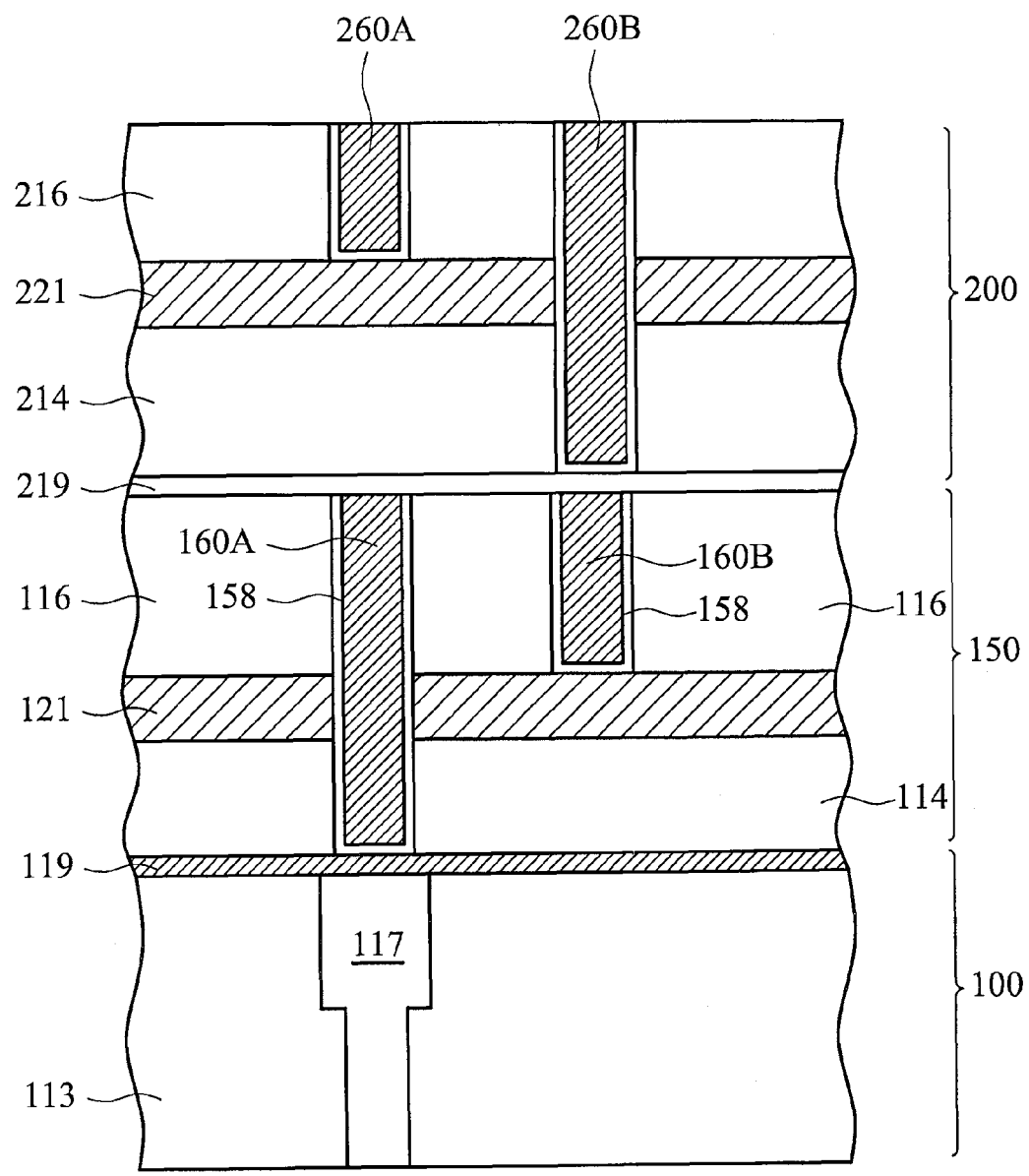

Following the proceeding steps, the necessary photolithography, via/trench etch and conductor filling processes used to form interconnect structure 150 may be used to create interconnect structures in higher interconnect levels by repeating the respective steps described above. As an example, a resulting structure 200 is illustrated in FIG. 4F, which includes via dielectric layer 214, hard-mask 221, trench dielectric layer 216, interconnect structures 260A and 260B.

Advantageous features of different embodiments include the following. Firstly, the formation of trench and via openings is performed through a single photolithography and etching process cycle. Alignment between a via mask layer and a trench mask layer as required by the prior art dual damascene approach is not necessary. This may eliminate the metal bridges/opens problem due to the misalignment of a via and a trench photomask. Secondly, the approach of forming the interconnect structures in preferred embodiments does not involve consecutive photolithography-etch cycles as used in the existing dual damascene process, thus the problem of filling anti-reflective materials (e.g., ARD) in narrow, high-aspect-ratio etch openings may be avoided.

Although the present invention and its advantages have been described in detail, it should be understood that various changes, substitutions and alterations can be made herein without departing from the spirit and scope of the invention as defined by the appended claims. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an interconnect structure in an integrated circuit (IC) comprising:
  forming a via dielectric layer on a surface of a substrate, wherein the via dielectric layer is a single low-k dielectric material;
  forming an etch stop layer directly atop the via dielectric layer;
  patterning the etch stop layer to form openings through the etch stop layer of a first width;
  forming a trench dielectric layer over the patterned etch stop layer, wherein the forming the trench dielectric layer further comprises:
    depositing a first layer of a first oxide material using a plasma enhanced chemical vapor deposition process in direct physical contact with the etch stop layer, the first layer of the first oxide material having a first thickness greater than about 1000 Å; and
  planarizing the first layer using a sacrificial layer different from the first oxide material, wherein the sacrificial layer is completely removed during the planarizing the first layer;
    after the planarizing the first layer, depositing a second layer of the first oxide material using a high density plasma chemical vapor deposition process in direct physical contact with the first layer of first oxide material and to a second thickness of greater than about 1000 Å;
  forming trench openings in the trench dielectric layer overlying the openings in etch stop layer;
  forming via openings of a second width in the via dielectric layer through respective ones of the trench openings of the trench dielectric layer and through respective ones of the openings of the etch stop layer, the second width being smaller than the first width, the forming via openings beginning after the patterning the etch stop layer has been completed, wherein respective portions of each one of the via openings closest to the etch stop layer are laterally separated from the etch stop layer, wherein the via openings are centered with the openings; and
  forming a conductive material within the via openings and in physical connection with a conductive region within the substrate.

2. The method of claim 1, wherein the via and the trench dielectric layers comprise a low-k dielectric material.

3. The method of claim 1, wherein the etch stop layer comprises a material selected from the group consisting of: silicon nitride (SiN), silicon oxynitride (SiON), silicon carbon nitride (SiCN), and combinations thereof.

4. The method of claim 1, wherein the first width is about 10% to about 50% larger than the second width.

5. The method of claim 1, wherein the trench openings and the via openings are formed with a common photolithography and etch step.

6. The method of claim 1, wherein forming the trench dielectric layer comprises forming a first dielectric layer with a high-density plasma (HDP) chemical vapor deposition (CVD) process, and forming a second dielectric layer directly atop the first dielectric layer with a plasma-enhanced chemical vapor deposition (PECVD) process.

7. The method of claim 6, wherein the first dielectric layer comprises silicon dioxide and the second dielectric layer comprises a material selected from the group consisting of: silicon dioxide and a low-k dielectric material.

8. The method of claim 6 further comprising etching back the first dielectric layer after forming the first dielectric layer, but prior to forming the second dielectric layer.

9. The method of claim 6 further comprising planarizing the substrate surface with a chemical-mechanical polishing process (CMP) after forming the trench dielectric layer.

10. The method of claim 1 wherein the conductive material is a conductive metal selected from the group consisting of: aluminum (Al), copper (Cu), silver (Ag), tungsten (W), and alloys thereof.

11. A method for forming an interconnect structure in an integrated circuit (IC) comprising:
  forming a first dielectric layer on a substrate, the substrate comprising a conductive line, wherein the first dielectric layer is a single material throughout the first dielectric layer, wherein the single material has a dielectric constant that is lower than or equal to a dielectric constant of silicon dioxide;
  forming an etch stop layer directly atop the first dielectric layer, the etch stop layer comprising a single first material along an upper surface of the etch stop layer;
  using a first photolithography process to form openings through the etch stop layer;
  forming a second dielectric layer directly on the etch stop layer, wherein forming the second dielectric layer comprises forming an underlying dielectric layer with a high-density plasma (HDP) chemical vapor deposition (CVD) process to a first thickness of at least 1000 Å and forming an overlying dielectric layer with a plasma-enhanced chemical vapor deposition (PECVD) process to a second thickness of at least 1000 Å, wherein the underlying dielectric layer and the overlying dielectric layer are a same dielectric material and wherein the underlying dielectric layer has an entire upper surface that is planar and further than about 100 nm away from the substrate than a top surface of the conductive line, wherein the upper surface is planarized by putting down a sacrificial layer different from the underlying layer and then completely removing the sacrificial layer prior to the forming the overlying dielectric layer;

using a second photolithography process to form trench openings in the second dielectric layer, the trench openings being substantially aligned with the openings in the etch stop layer, each of the openings in the etch stop layer being aligned with only a single trench opening;

forming via openings in the first dielectric layer after the using the using the first photolithography process to form openings through the etch stop layer has been completed, the via openings having a smaller width than the openings and being laterally separated from the openings by a portion of the second dielectric layer within the openings, wherein a center of one of the via openings is center aligned with a center of one of the openings; and filling the via openings and trench openings with conductive material to form an interconnect to the conductive line.

12. The method of claim 11 wherein the substrate comprises a dielectric layer, a conducting layer, a barrier layer, an adhesion promoting layer, a semiconductor wafer or any combinations thereof.

13. The method of claim 11 wherein the first photolithography process is performed using a via mask layer.

14. The method of claim 11 wherein the second dielectric layer substantially completely fills the openings in the etch stop layer.

15. The method of claim 11 wherein the first and the second photolithography processes are each an immersion lithography process.

16. The method of claim 11 wherein the first and the second dielectric layers comprise a low-k dielectric material.

17. The method of claim 11 further comprising etching back the underlying dielectric layer prior to forming the overlying dielectric layer.

18. The method of claim 11 further comprising planarizing the surface of the overlying dielectric layer through a CMP process.

19. The method of claim 11 wherein the conductive material comprises a conductive metal selected from the group consisting of: aluminum (Al), copper (Cu), silver (Ag), tungsten (W), and alloys thereof.

20. A method for forming an interconnect structure in an integrated circuit (IC) comprising:
    forming a via dielectric layer on a surface of a substrate, wherein the via dielectric layer has a first low-k dielectric material adjacent to the surface of the substrate;
    forming an etch stop layer directly atop the first low-k dielectric material, wherein the etch stop layer has a top surface that is only a single material;
    patterning the etch stop layer to form openings through the etch stop layer;
    forming a first dielectric layer to a first thickness of greater than about 1000 Å using plasma enhanced chemical vapor deposition over the patterned etch stop layer, the first dielectric layer filling the openings through the etch stop layer;
    applying a sacrificial material to the first dielectric layer;
    planarizing the sacrificial material and the first dielectric layer, wherein the sacrificial material is completely removed during the planarizng the sacrificial material and the first dielectric layer;
    after the planarizing the sacrificial material and the first dielectric layer, forming a second dielectric layer to a second thickness of greater than about 1000 Å using high density plasma chemical vapor deposition directly atop the first dielectric layer;
    forming an anti-reflective coating over the second dielectric layer, the anti-reflective coating comprising amorphous carbon, an oxide over the amorphous carbon, and a bottom anti-reflective coating over the amorphous carbon;
    forming trench openings of a first width in the first and the second dielectric layers overlying the openings in etch stop layer;
    forming via openings of a second width in the via dielectric layer through the openings of the trench openings and the etch stop layer after the patterning the etch stop layer had been completed, wherein the via openings extend fully through the via dielectric layer and are centered with respective ones of the openings through the etch stop layer, and wherein top most portions of sidewalls of the via openings are laterally separated from respective ones of the openings through the etch stop layer; and
    filling the via openings and the trench openings with a conductive material, wherein the conductive material is in physical contact with a conductive region of the substrate.

21. The method of claim 20, wherein the first dielectric layer is formed using a high-density plasma (HDP) chemical vapor deposition (CVD) process, and wherein the second dielectric layer is formed using a plasma-enhanced chemical vapor deposition (PECVD) process.

* * * * *